(12) United States Patent
Chang et al.

(10) Patent No.: US 11,127,746 B2
(45) Date of Patent: Sep. 21, 2021

(54) FIN-BASED STRAP CELL STRUCTURE FOR IMPROVING MEMORY PERFORMANCE

(71) Applicant: Taiwan Semiconductor Manufacturing Co., Ltd., Hsin-Chu (TW)

(72) Inventors: Feng-Ming Chang, Hsinchu County (TW); Chia-Hao Pao, Kaohsiung (TW); Lien Jung Hung, Taipei (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 57 days.

(21) Appl. No.: 16/529,380

(22) Filed: Aug. 1, 2019

(65) Prior Publication Data

US 2020/0251476 A1 Aug. 6, 2020

Related U.S. Application Data

(60) Provisional application No. 62/799,520, filed on Jan. 31, 2019.

(51) Int. Cl.
*H01L 29/76* (2006.01)
*H01L 27/088* (2006.01)
*H01L 23/48* (2006.01)
*H01L 21/336* (2006.01)
*H01L 21/4763* (2006.01)
*H01L 21/44* (2006.01)
*H01L 27/11* (2006.01)
*H01L 23/535* (2006.01)
*H01L 23/528* (2006.01)
*H01L 27/108* (2006.01)
*H01L 23/522* (2006.01)

(52) U.S. Cl.
CPC ........ *H01L 27/1104* (2013.01); *H01L 23/528* (2013.01); *H01L 23/5221* (2013.01); *H01L 23/535* (2013.01); *H01L 27/108* (2013.01); *H01L 27/1116* (2013.01)

(58) Field of Classification Search
CPC .............. H01L 27/785; H01L 23/5221; H01L 27/1104; H01L 23/535; H01L 27/1116; H01L 23/528; H01L 27/108; H01L 27/11
See application file for complete search history.

(56) References Cited

U.S. PATENT DOCUMENTS 6,118,158 A 9/2000 Kim
8,716,808 B2 5/2014 Deng et al.
(Continued)

*Primary Examiner* — Alonzo Chambliss
(74) *Attorney, Agent, or Firm* — Haynes and Boone, LLP

(57) ABSTRACT

Fin-based well straps are disclosed for improving performance of memory arrays, such as static random access memory arrays. An exemplary well strap cell is disposed between a first memory cell and a second memory cell. The well strap cell includes a p-well, a first n-well, and a second n-well disposed in a substrate. The p-well, the first n-well, and the second n-well are configured in the well strap cell such that a middle portion of the well strap cell is free of the first n-well and the second n-well along a gate length direction. The well strap cell further includes p-well pick up regions to the p-well and n-well pick up regions to the first n-well, the second n-well, or both. The p-well has an I-shaped top view along the gate length direction.

20 Claims, 9 Drawing Sheets

(56) References Cited

U.S. PATENT DOCUMENTS

| | | | |
|---|---|---|---|
| 9,607,685 B2* | 3/2017 | Liaw | G11C 8/16 |
| 10,157,987 B1* | 12/2018 | Liaw | H01L 27/0924 |
| 10,629,684 B2* | 4/2020 | Liaw | H01L 27/1104 |
| 2020/0335585 A1* | 10/2020 | Liaw | H01L 29/1037 |

* cited by examiner

FIN-BASED STRAP CELL STRUCTURE FOR IMPROVING MEMORY PERFORMANCE

This is a non-provisional application of and claims benefit of U.S. Provisional Patent Application Ser. No. 62/799,520, filed Jan. 31, 2019, the entire disclosure of which is incorporated herein by reference.

BACKGROUND

Static random access memory ("SRAM") generally refers to any memory or storage that can retain stored data only when power is applied. As integrated circuit (IC) technologies progress towards smaller technology nodes, SRAMs often incorporate fin-based structures, such as fin-like field effect transistors (FinFETs), into SRAM cells to enhance performance, where each SRAM cell can store a bit of data. Since SRAM cell performance is largely layout dependent (for example, it has been observed that an inner SRAM cell of a SRAM array will perform differently than an edge SRAM cell of the SRAM array), fin-based well strap cells have been implemented to stabilize well potential, facilitating uniform charge distribution throughout a SRAM array, and thus uniform performance among SRAM cells of the SRAM array. However, as fin dimensions shrink, fin-based well strap cells have been observed to increase pick-up resistance and/or reduce latch-up performance of SRAM arrays. Accordingly, although existing well strap cells for SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
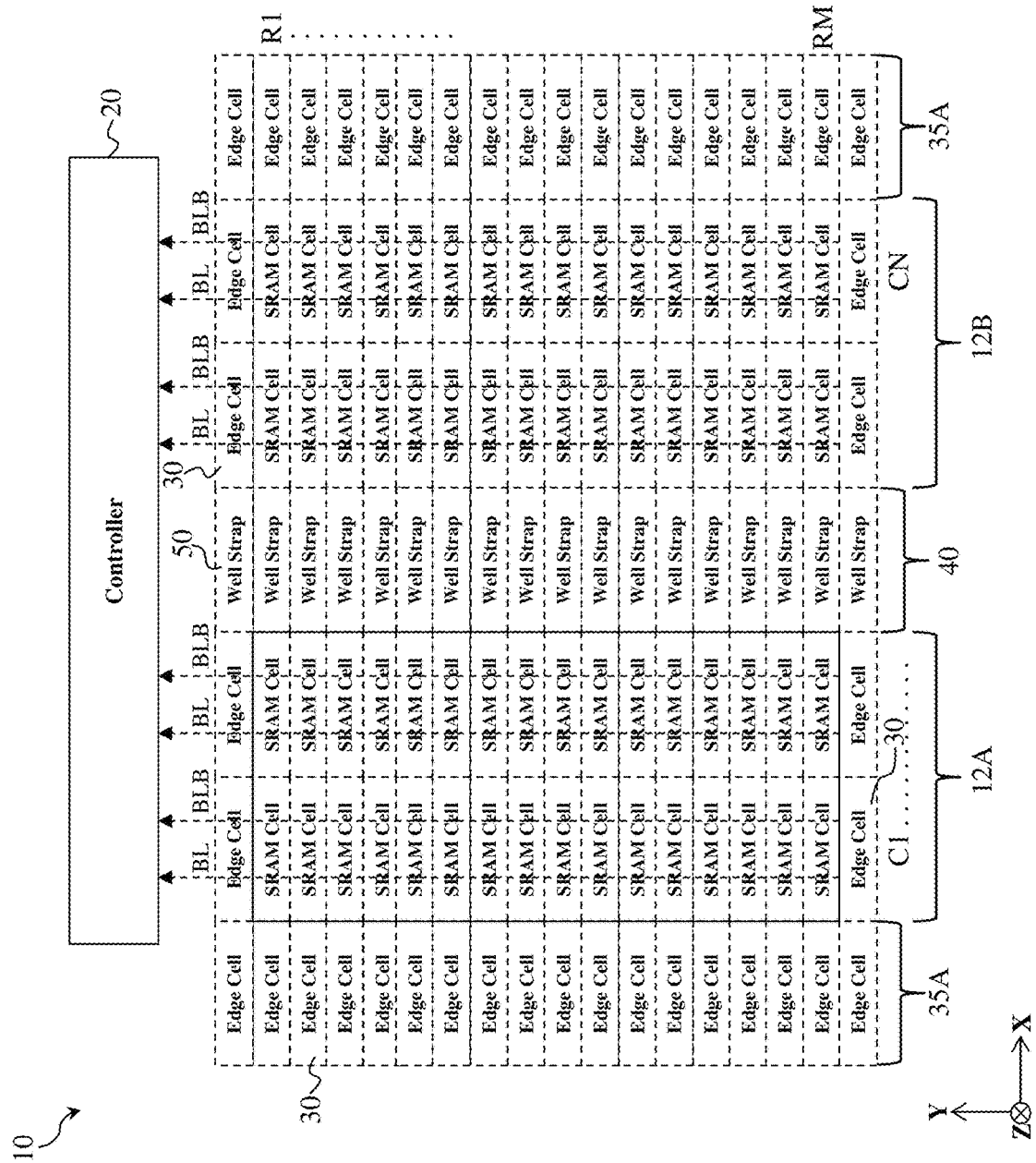
FIG. 1 is a fragmentary diagrammatic plan view of a memory according to various aspects of the present disclosure.

The present disclosure relates generally to integrated circuit (IC) devices, and more particularly, to fin-based strap cell structures for improving memory performance.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, fin-like field effect transistors (FinFETs) (also referred to as non-planar transistors) have become a popular and promising candidate for high performance and low leakage applications. Memory arrays, such as static random access memory (SRAM) arrays, often incorporate FinFETs into memory cells to enhance performance, where each memory cell can store a bit of data. Memory cell performance is largely layout dependent. For example, it has been observed that an inner memory cell of a memory array will perform differently than an edge memory cell of the memory array. In some implementations, inner memory cells and edge memory cells exhibit different threshold voltages ($V_t$), different on-currents ($I_{on}$), and/or a different off-currents ($I_{off}$). Fin-based well strap cells have thus been implemented to stabilize well potential, facilitating uniform charge distribution throughout a memory array, and thus uniform performance among memory cells of the memory array. A fin-based well strap (also referred to as an electrical tie) electrically connects a well region corresponding with a FinFET of a memory cell to a voltage node (or voltage line). For example, a fin-based n-type well strap electrically connects an n-well region corresponding with a p-type FinFET to a voltage node, such as a voltage node associated with the p-type transistor, and a fin-based p-type well strap electrically connects a p-well region corresponding with an n-type FinFET to a voltage node, such as a voltage node associated with the n-type transistor.

As FinFET technologies progress towards smaller technology nodes (for example, 20 nm, 16 nm, 10 nm, 7 nm, and below), decreasing fin pitch and decreasing fin width have been observed to diminish benefits provided by fin-based well straps. For example, decreasing fin widths have been observed to increase well pick-up resistance, such that a well pick-up resistance of fin-based (non-planar based) well straps is much higher than a well pick-up resistance of planar-based well straps. Such increases in well pick-up resistance have been observed to degrade latch-up performance of memory arrays using fin-based well straps. The present disclosure thus proposes modifications to fin-based well strap cells that can achieve improvements in performance. For example, as described herein, modifying a well doping configuration of the fin-based well strap cells, such that the well doping configuration of the fin-based well strap cells is different than a well doping configuration of the fin-based memory cells, has been observed to significantly improve memory performance. In some embodiments, n-wells are removed from p-type well straps of the fin-based well strap cells to reduce well pick-up resistance associated with the p-type well straps without affecting desired characteristics of its corresponding FinFETs (for example, voltage threshold) and/or requiring significant modifications to existing fabrication techniques. In such embodiments, the p-type well straps include only a p-well, while the n-type well straps include an n-well disposed between p-wells. In some embodiments, such well doping configurations of the n-type well straps are the same as the well doping configurations in the fin-based memory cells. In some embodiments, a fin-based well strap cell includes a p-type well strap disposed between n-type well straps, where the p-well of the p-type well strap and the p-wells of the n-type well straps combine to form an I-shaped p-well in the fin-based well strap cell. In such embodiments, the n-type well strap are edge portions of the fin-based well strap cell, and the p-type well strap is a middle portion of the fin-based well strap cell. In some embodiments, the disclosed fin-based well strap cells are disposed between memory cells. Details of the proposed fin-based well strap cell structures for improving memory performance are described below. Different embodiments may have different advantages, and no particular advantage is required of any embodiment.

FIG. 1 is a diagrammatic plan view of a memory 10, which can implement well straps configured as described herein, according to various aspects of the present disclosure. Memory 10 is configured as a static random access memory (SRAM). However, the present disclosure contemplates embodiments where memory 10 is configured as another type of memory, such as a dynamic random access memory (DRAM), a non-volatile random access memory (NVRAM), a flash memory, or other suitable memory. Memory 10 may be included in a microprocessor, a memory, and/or other IC device. In some implementations, memory 10 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs, depending on design requirements of memory 10. FIG. 1 has been simplified for the sake of clarity to better understand the inventive concepts of the present disclosure. Additional features can be added in memory 10, and some of the features described below can be replaced, modified, or eliminated in other embodiments of memory 10.

Memory 10 includes a memory array 12A and a memory array 12B, where memory array 12A and memory array 12B each include memory cells 20, such as SRAM cells (also referred to as bit cells), for storing data. Memory cells 20 include various transistors, such as p-type FinFETs and/or n-type FinFETs, configured to facilitate reading and writing of data to memory cells 20. Memory cells 20 are arranged in column 1 (C1) to column N (CN) extending along a first direction (here, in a y-direction) and row 1 (R1) to row M (RM) extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 20 in true form and complementary form on a column-by-column basis. R1 to RM each includes a word line (WL) that facilitates access to respective memory cells 20 on a row-by-row basis. Each memory cell 20 is electrically connected to a respective BL, a respective BLB, and a respective WL, which are electrically connected to a controller 20. Controller 20 is configured to generate one or more signals to select at least one WL and at least one bit line pair (here, BL and BLB) to access at least one of memory cells 20 for read operations and/or write operations. Controller 20 includes any circuitry suitable to facilitate read/write operations from/to memory cells 20, including but not limited to, a column decoder circuit, a row decoder circuit, a column selection circuit, a row selection circuit, a read/write circuit (for example, configured to read data from and/or write data to memory cells 20 corresponding to a selected bit line pair (in other words, a selected column)), other suitable circuit, or combinations thereof. In some implementations, controller 20 includes at least one sense amplifier configured to detect and/or amplify a voltage differential of a selected bit line pair. In some implementations, the sense amplifier is configured to latch or otherwise store data values of the voltage differential.

A perimeter of memory 10 is configured with dummy cells, such as edge dummy cells and well strap cells, to ensure uniformity in performance of memory cells 20. Dummy cells are configured physically and/or structurally similar to memory cells 20, but do not store data. For example, dummy cells can include p-type wells, n-type wells, fin structures (including one or more fins), gate structures, source/drain features, and/or contact features. Well strap cells generally refer to dummy cells that are configured to electrically connect a voltage to an n-type well of memory cells 20, a p-type well of memory cells 20, or both. In the depicted embodiment, memory 10 includes edge dummy cells 30 arranged along the first direction (here, the y-direction) into an edge dummy cell column 35A and an edge dummy cell column 35B, where each R1 to RM of memory cells 20 is disposed between one edge dummy cell 30 of edge dummy cell column 35A and one edge dummy cell 30 of edge dummy cell column 35B. In furtherance of the depicted embodiment, each C1 to CM of memory cells 20 is disposed between edge dummy cells 30. In some implementations, edge dummy cell column 35A and/or edge dummy cell column 35B extend substantially parallel to at least one bit line pair (here, BL and BLB) of memory 10. In some implementations, edge dummy cells 30 are configured to connect respective memory cells 20 to respective WLs. In some implementations, edge dummy cells 30 include circuitry for driving WLs. In some implementations, edge dummy cells 30 are electrically connected to a power supply voltage $V_{DD}$ (for example, a positive power supply voltage) and/or a power supply voltage $V_{SS}$ (for example, an electrical ground).

In furtherance of the depicted embodiment, a well strap column 40 includes well strap cells 50 arranged along the first direction (here, the y-direction). Well strap column 40 is disposed between memory array 12A and memory array 12B, such that each row of memory cells 20 in memory array 12A is disposed between a respective edge dummy cell 30 and a respective well strap cell 50 and each row of memory cells 20 in memory array 12B is disposed between a respective well strap cell 50 and a respective edge dummy cell 30. In some implementations, well strap column 40 extends substantially parallel to at least one bit line pair (here, BL and BLB) of memory 10. In the depicted embodiment, well strap cells 50 include an n-type well strap, a p-type well strap, or combinations thereof. In some implementations, well strap cells 50 include a p-type well strap disposed between n-type well straps. The n-type well strap is configured to electrically couple an n-type well that corresponds with at least one p-type FinFET of memory cells 20 to a voltage source. The p-type well strap is configured to electrically couple a p-type well that corresponds with at least one n-type FinFET of memory cells 20 to a voltage source. As described herein, well strap cells are configured to significantly reduce well pick-up resistance, improving latch-up performance of memory 10.

Figure 2A:
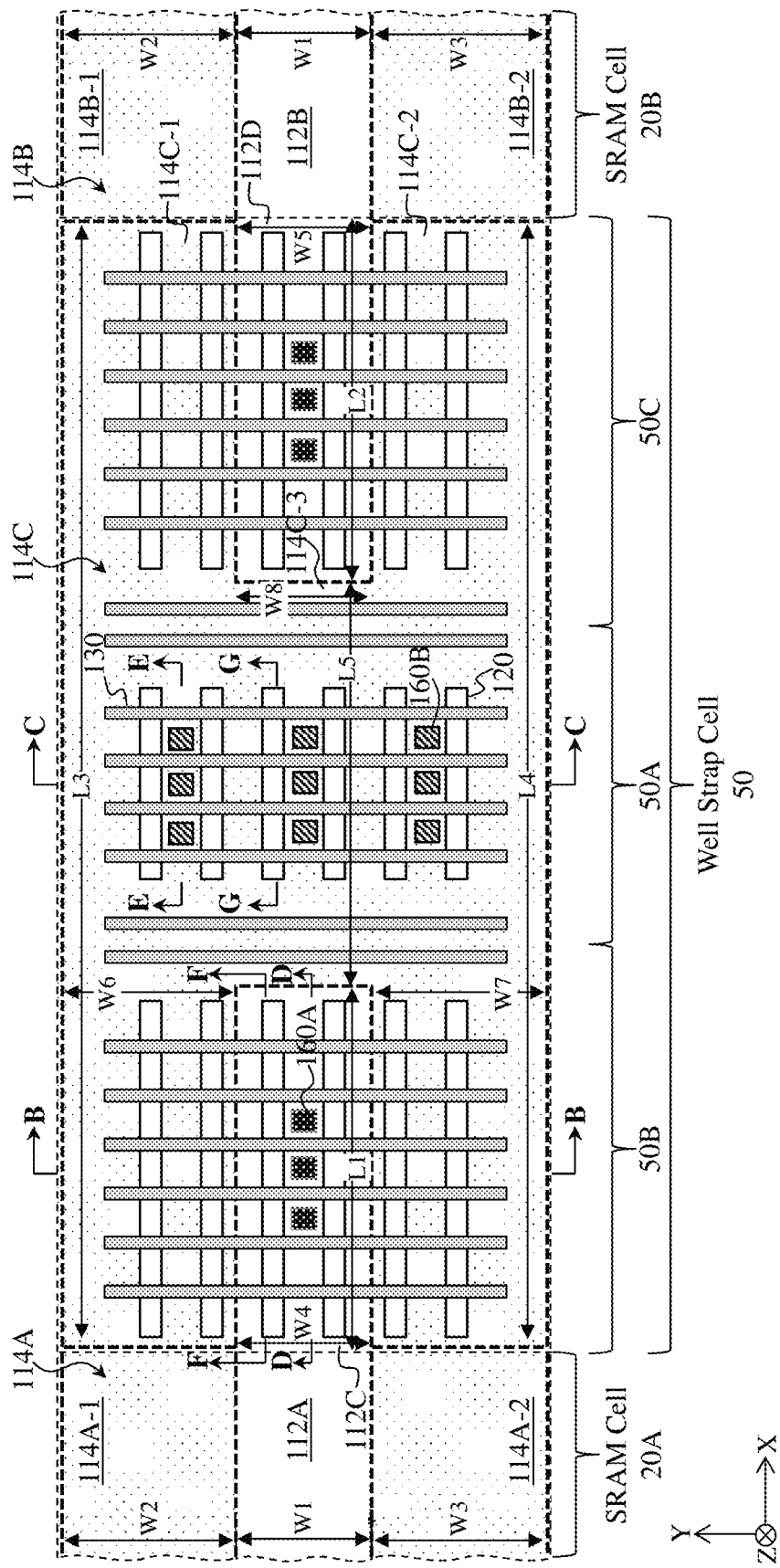
FIG. 2A, FIG. 2B, FIG. 2C, FIG. 2D, FIG. 2E, FIG. 2F, and FIG. 2G are fragmentary diagrammatic views of a well strap cell, in portion or entirety, that can be implemented in the memory of FIG. 1 according to various aspects of the present disclosure.
Figure 2B:
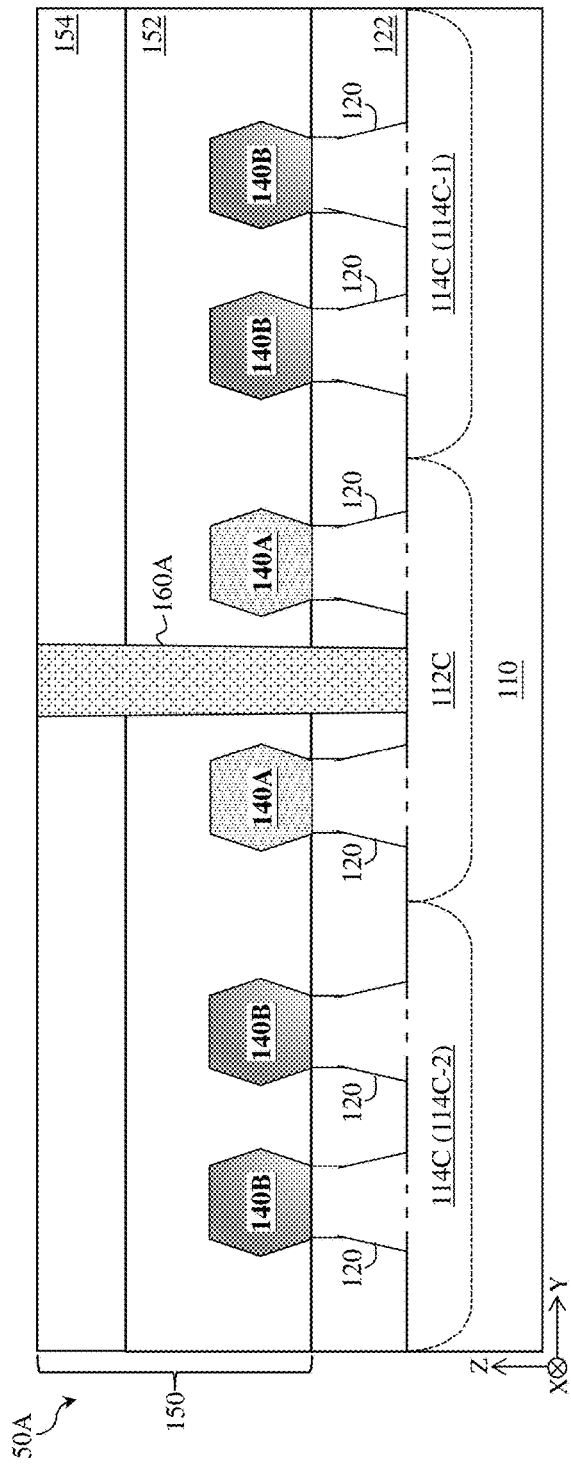
Figure 2C:
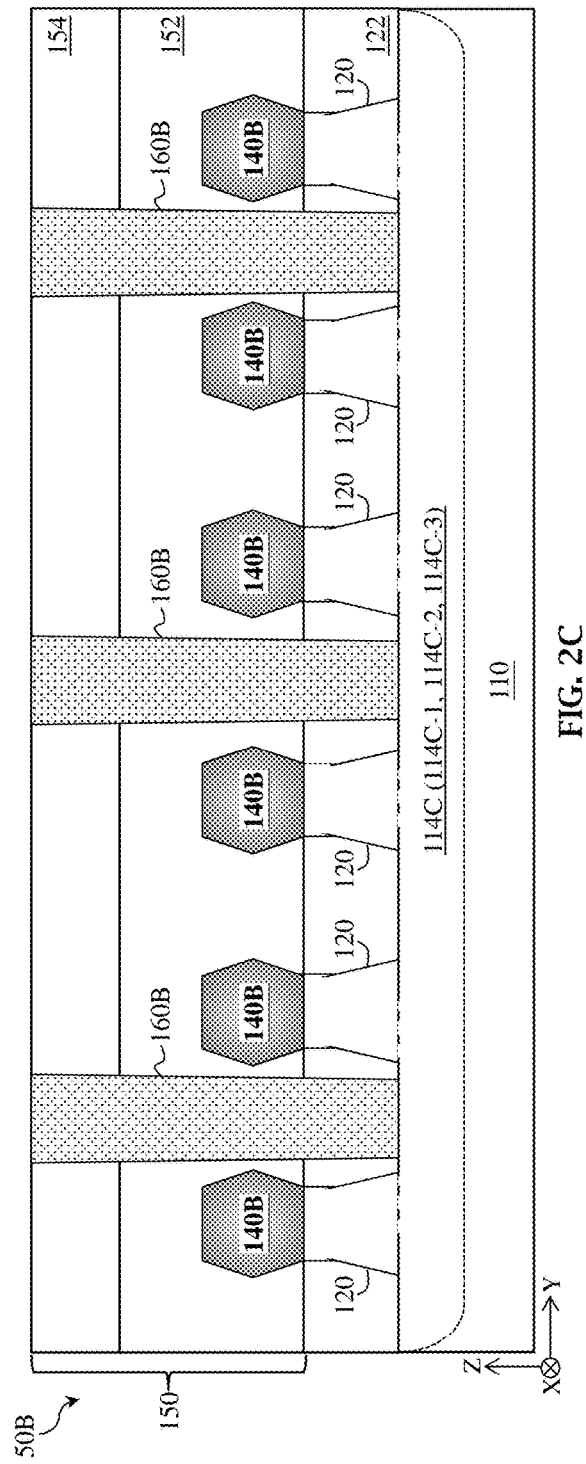
Figure 2D:
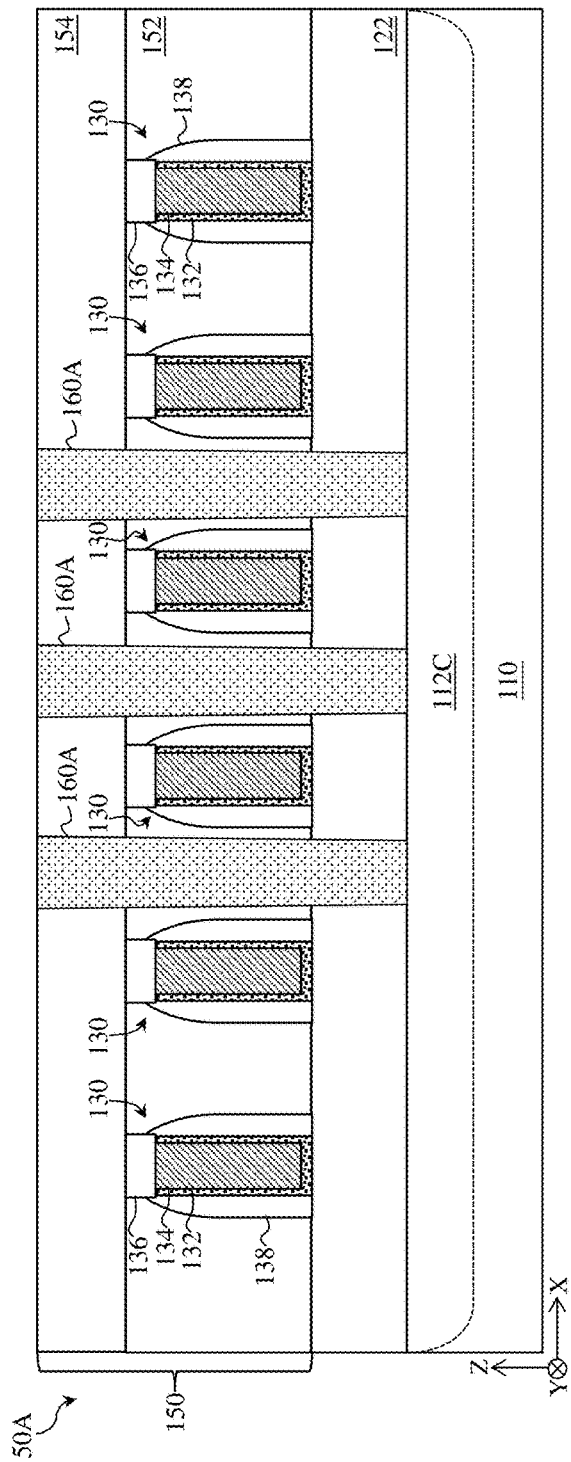
Figure 2E:
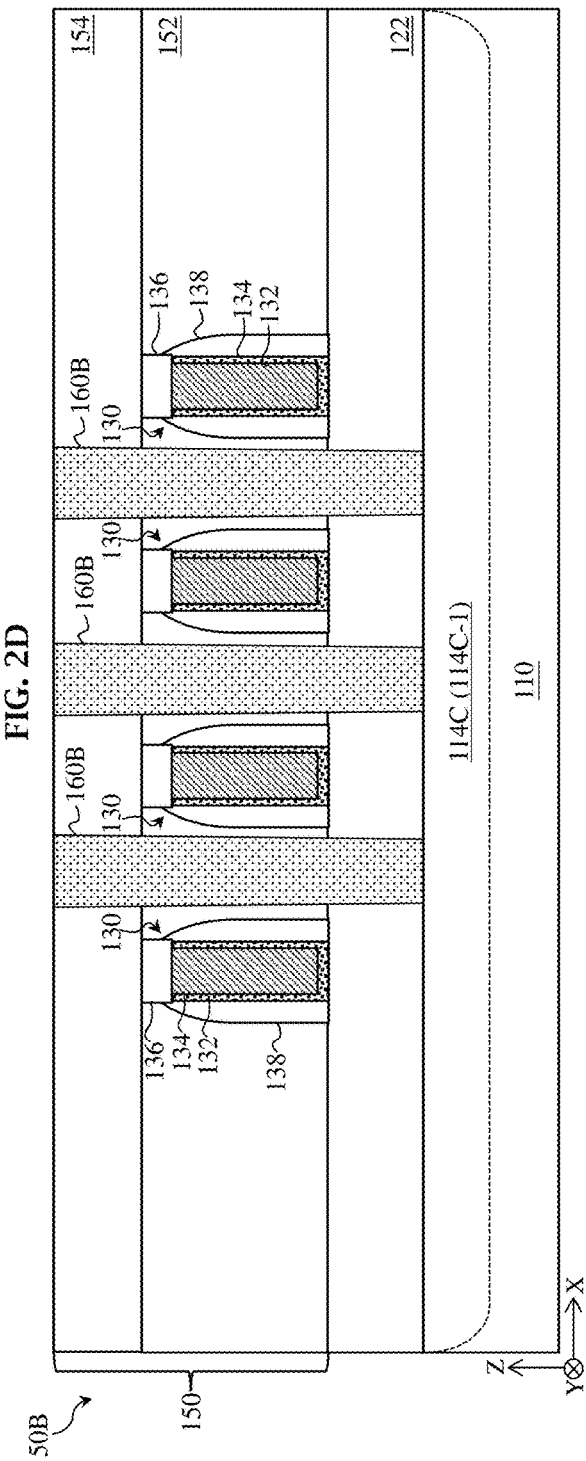
Figure 2F:
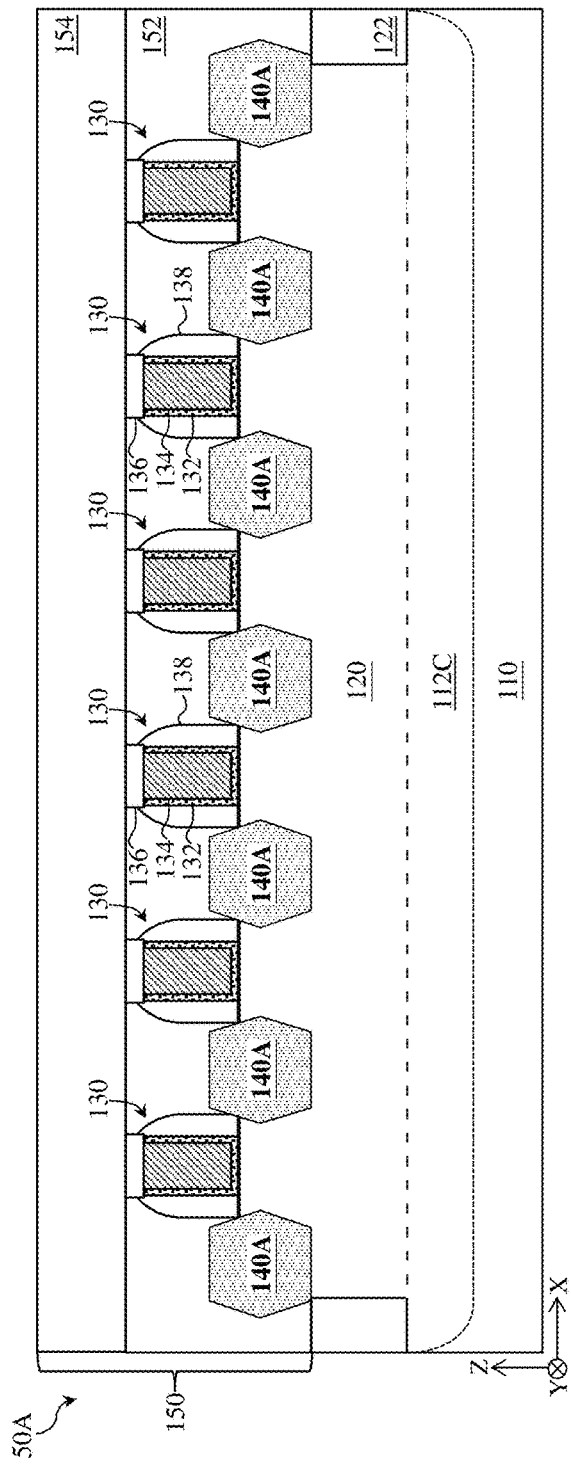
Figure 2G:
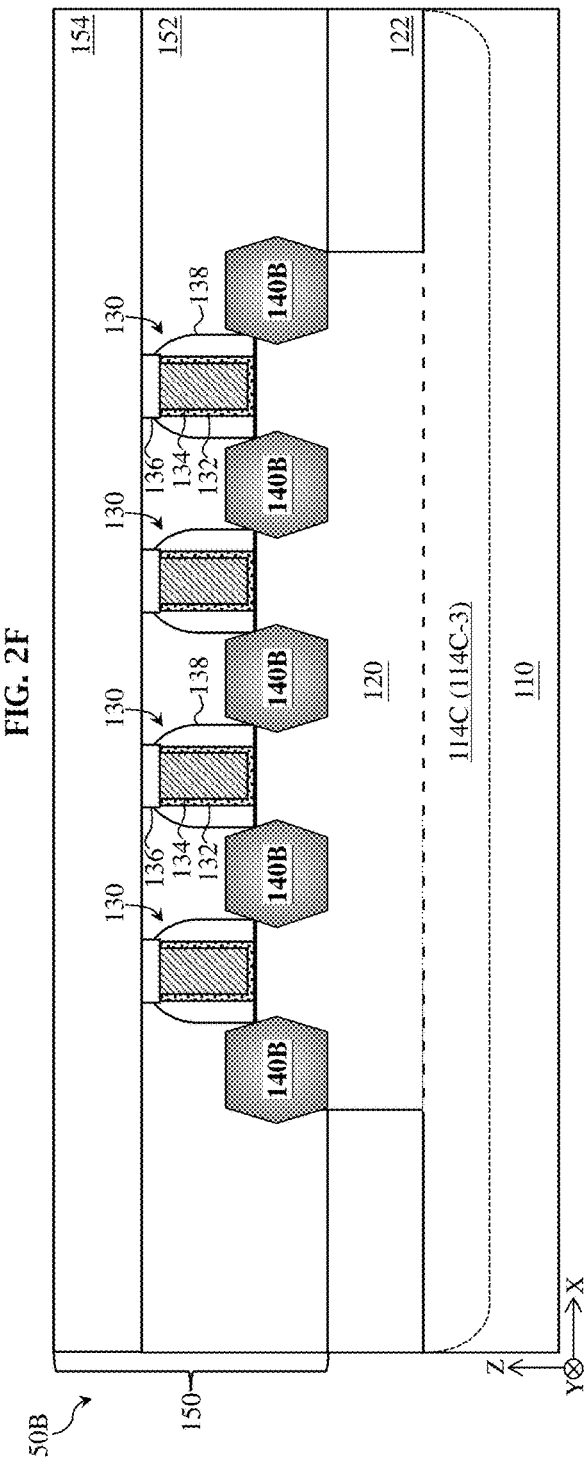

FIGS. 2A-2G are fragmentary diagrammatic views of a well strap cell, in portion or entirety, such as well strap cell 50 implemented in memory 10 of FIG. 1., according to various aspects of the present disclosure. FIG. 2A is a simplified schematic top view of well strap cell 50 (for example, in an x-y plane); FIG. 2B is a diagrammatic cross-sectional view of well strap cell 50 along line B-B of FIG. 2A (for example, in a y-z plane); FIG. 2C is a diagrammatic cross-sectional view of well strap cell 50 along line C-C of FIG. 2A (for example, in a y-z plane); FIG. 2D is a diagrammatic cross-sectional view of well strap cell 50 along line D-D of FIG. 2A (for example, in an x-z plane); FIG. 2E is a diagrammatic cross-sectional view of well strap cell 50 along line E-E of FIG. 2A (for example, in an x-z plane); FIG. 2F is a diagrammatic cross-sectional view of well strap cell 50 along line F-F of FIG. 2A (for example, in an x-z plane); and FIG. 2G is a diagrammatic cross-sectional view of well strap cell 50 along line G-G of FIG. 2A (for example, in an x-z plane). Well strap cell 50 is disposed between a SRAM cell 20A of memory cells 20 and a SRAM cell 20B of memory cells 20. In some implementations, a width of well strap cell 50 (here, along a y-direction) is substantially equal to a width of memory cells 20 (here, SRAM cells 20A, 20B). Well strap cell 50 includes a p-type well strap 50A disposed between an n-type well strap 50B and an n-type well strap 50C along a length of well strap cell 50 (here, along an x-direction). In such configuration, n-type well strap 50B is disposed adjacent to a respective memory cell 20, such as SRAM cell 20A, and n-type well strap 50C is disposed adjacent to a respective memory cell 20, such as SRAM cell 20B. In some implementations, p-type well strap 50A is arranged between n-type well strap 50B and n-type well strap 50C along a fin length direction. P-type well strap 50A is configured to electrically connect p-type wells of memory cells 20 to a first power supply voltage, such as a power supply voltage $V_{SS}$. N-type well strap 50B and n-type well strap 50C are each configured to electrically connect n-type wells of memory cells 20 to a second power supply voltage, such as a power supply voltage $V_{DD}$. In some implementations, power supply voltage $V_{DD}$ is a positive power supply voltage, and power supply voltage $V_{SS}$ is an electrical ground. FIGS. 2A-2G have been simplified for the sake of clarity to better understand the inventive concepts of the present disclosure. Additional features can be added in well strap cell 50, and some of the features described below can be replaced, modified, or eliminated in other embodiments of well strap cell 50.

Well strap cell 50 is configured physically and/or structurally similar to memory cells 20. For example, well strap cell 50 includes a substrate (wafer) 110. In the depicted embodiment, substrate 110 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 110 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 110 includes doped regions, such as an n-type doped region 112A, an n-type doped region 112B, an n-type doped region 112C, an n-type doped region 112D, a p-type doped region 114A, a p-type doped region 114B, and a p-type doped region 114C (referred to hereafter as n-wells 112A-112D and p-wells 114A-114C). N-type doped regions, such as n-wells 112A-112D, are doped with n-type dopants, such as phosphorus, arsenic, other n-type dopant, or combinations thereof. P-type doped regions, such as p-wells 114A-114C, are doped with p-type dopants, such as boron, indium, other p-type dopant, or combinations thereof. In some implementations, substrate 110 includes doped regions formed with a combination of p-type dopants and n-type dopants. The various doped regions can be formed directly on and/or in substrate 110, for example, providing a p-well structure, an n-well structure, a dual-well structure, a raised structure, or combinations thereof. An ion implantation process, a diffusion process, and/or other suitable doping process can be performed to form the various doped regions.

The various doped regions are configured according to design requirements of memory 10. SRAM cells 20A, 20B each include an n-well region disposed between p-well regions. For example, SRAM cell 20A includes n-well 112A and p-well 114A, and SRAM cell 20B includes n-well 112B and p-well 114B. N-wells 112A, 112B are configured for PMOS FinFETs, such as a pull-up (PU) FinFETs, and p-wells 114A, 114B are configured for NMOS FinFETs, such as a pull-down (PD) FinFETs. P-well 114A includes a p-well sub-region 114A-1 and a p-well sub-region 114A-2, and p-well 114B includes a p-well sub-region 114B-1 and a p-well sub-region 114B-2. N-well 112A is disposed between p-well sub-region 114A-1 and p-well sub-region 114A-2 along the y-direction (here, along a gate length direction), and n-well 112B is disposed between p-well sub-region 114B-1 and p-well sub-region 114B-2 along the y-direction. N-well 112A, p-well sub-region 114A-1, and p-well sub-region 114A-2 extend along an entire length of SRAM cell 20A, such that lengths of n-well 112A, p-well sub-region 114A-1, and p-well sub-region 114A-2 are substantially equal to a length of SRAM cell 20A (here, along the x-direction). N-well 112B, p-well sub-region 114B-1, and p-well sub-region 114B-2 extend along an entire length of SRAM cell 20B, such that lengths of n-well 112B, p-well sub-region 114B-1, and p-well sub-region 114B-2 are substantially equal to a length of SRAM cell 20B (here, along the x-direction). N-wells 112A, 112B have a width W1, p-well sub-regions 114A-1, 114B-1 have a width W2, and p-well sub-regions 114A-2, 114B-2 have a width W3. Width W1, width W2, and width W3 are less than the width of SRAM cells 20A, 20B. In the depicted embodiment, a sum of width W1, width W2, and width W3 is substantially equal to the widths of SRAM cells 20A, 20B (in other words, W1+W2+W3=width of SRAM cells 20A, 20B). In some implementations, width W1, width W2, and width W3 are the same. In some implementations, width W1, width W2, and width W3 are different. In some implementations, width W2 and width W3 are the same, yet are different than width W1. The present disclosure contemplates any configuration of width W1, width W2, and width W3.

The present disclosure proposes a well doping configuration in well strap cell 50 that significantly reduces well pick-up resistance, particularly well pick-up resistance associated with p-type well strap 50A. In FIGS. 2A-2G, well strap cell 50 includes n-well 112C, n-well 112D, and p-well 114C. P-well 114C is I-shaped in a top view along a width of well strap cell 50 (here, along the y-direction) and H-shaped in the top view along a length of well strap cell 50 (here, along the x-direction). For example, p-well 114C includes a p-well sub-region 114C-1, a p-well sub-region 114C-2, and a p-well sub-region 114C-3. N-well 112C is disposed between p-well sub-region 114C-1 and p-well sub-region 114C-2 in n-type well strap 50B, and n-well 112D is disposed between p-well sub-region 114C-1 and p-well sub-region 114C-2 in n-type well strap 50C. N-well 112C extends without interruption into n-well 112A and n-well 112D extends without interruption into n-well 112B. In some implementations, no actual interface may be observed between n-well 112C and n-well 112A and no actual interface may be observed between n-well 112D and n-well 112B. N-well 112C has a length L1 and a width W4. N-well 112D has a length L2 and a width W5. Length L1 is less than the length of well strap cell 50 and substantially equal to a length of n-type well strap 50B. Length L2 is less than the length of well strap cell 50 and substantially equal to a length of n-type well strap 50C. Widths W4, W5 are substantially equal to width W1 of n-wells 112A, 112B of SRAM cells 20A, 20B. In the depicted embodiment, width W4 is substantially equal to width W5, though the present disclosure contemplates embodiments where width W4 is greater than or less than width W5.

P-well sub-regions 114C-1, 114C-2 extend along an entire length of well strap cell 50. P-well sub-regions 114C-1, 114C-2 thus span p-type well strap 50A, n-type well strap 50B, and n-type well strap 50C. P-well sub-region 114C-1 extends without interruption into p-well sub-regions 114A-1, 114B-1 respectively of p-wells 114A, 114B. In some implementations, no actual interface may be observed between p-well sub-region 114C-1 and p-well sub-regions 114A-1, 114B-1. P-well sub-region 114C-2 extends without interruption into p-well sub-regions 114A-2, 114B-2 respectively of p-wells 114A, 114B. In some implementations, no actual interface may be observed between p-well sub-region 114C-2 and p-well sub-regions 114A-2, 114B-2. P-well sub-region 114C-1 has a length L3 and a width W6. P-well sub-region 114C-2 has a length L4 and a width W7. Lengths L3, L4 are substantially equal to the length of well strap cell 50. Widths W6, W7 are less than the width of well strap cell 50. In the depicted embodiment, width W6 is substantially equal to width W2 of p-well sub-regions 114A-1, 114B-1 respectively of p-wells 114A, 114B, and width W7 is substantially equal to width W3 of p-well sub-regions 114A-2, 114B-2 respectively of p-wells 114A, 114B. In furtherance of the depicted embodiment, width W6 is substantially equal to width W7, though the present disclosure contemplates embodiments where width W6 is greater than or less than width W7.

P-well sub-region 114C-3 is disposed between p-well sub-region 114C-1 and p-well sub-region 114C-2 along the width of well strap cell 50 in p-type well strap 50A, such that p-well sub-region 114C-3, p-well sub-region 114C-2, and p-well sub-region 114C-1 combine to span an entirety of p-type well strap 50A. P-well sub-region 114C-3 is further disposed between n-well 112C and n-well 112D along the length of well strap cell 50. P-well sub-region 114C-3 thus forms a central (or middle) portion of well strap cell 50 and p-type well strap 50A. In some implementations, an axis of symmetry of p-well sub-region 114C-3 along the width (here, y) direction is substantially aligned with an axis of symmetry of p-well sub-region 114C-1 along the width direction and an axis of symmetry of p-well sub-region 114C-2 along the width direction. In such implementations, the axes of symmetry of p-well sub-regions 114C-1, 114C-2, and 114C-3 are aligned with an axis of symmetry. P-well sub-region 114C-3 has a length L5 and a width W8. Length L5 is less than the length of well strap cell 50 and substantially equal to a length of p-type well strap 50A. Width W8 is less than the width of well strap cell 50. In the depicted embodiment, width W8 is substantially equal to width W4 of n-well 112C and/or width W5 of n-well 112D (and thus is substantially equal to width W1 of n-wells 112A, 112B in SRAM cells 20A, 20B). In furtherance of the depicted embodiment, a sum of width W6, width W7, and width W8 is substantially equal to the width of well strap cell 50 (in other words, W6+W7+W8=width of well strap cell 50 and W8=width of well strap cell 50−(W6+W7)).

By implementing an I-shaped p-type well 114C in well strap cell 50, a well doping configuration of p-type well strap 50A is different than a well doping configuration of memory cells 20 (here, SRAM cells 20A, 20B), while well doping configurations of n-type well straps 50B, 50C are the same as the well doping configuration of memory cells 20. For example, p-type well strap 50A includes only a p-well and is free of an n-well, n-type well straps 50B, 50C include an n-well disposed between p-wells, and SRAM cells 20A, 20B include an n-well disposed between p-wells. In such configuration, well pick-up resistance associated with p-type well strap 50A is not confined because the p-well of p-type well strap 50A is not divided into discrete portions as in conventional well straps, but instead extends continuously without interruption in p-type well strap 50. This enables p-type well strap 50A to achieve complete well pick-up resistance and block noise from n-wells, such as those of n-type well straps 50B, 50C. For example, eliminating p-n junctions from p-type well strap 50A (and thus p-n depletion regions that can increase resistance when p-type well strap 50A is connected to voltage) has been observed to significantly reduce well pick-up resistance of p-type well strap 50A, leading to improved performance of memory 10.

Well strap cell 50 further includes fins 120 (also referred to as fin structures or active fin regions) disposed over substrate 110, where fins 120 are configured the same or similar to fins of n-type FinFETs and/or p-type FinFETs of SRAM cells 20A, 20B. Fins 120 are oriented substantially parallel to one another, each having a length defined in the x-direction, a width defined in the y-direction, and a height defined in a z-direction. Fins 120 each have at least one channel region, at least one source region, and at least one drain region defined along their length in the x-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions also include top portions defined between sidewall portions. In some implementations, fins 120 are a portion of substrate 110 (such as a portion of a material layer of substrate 110). For example, where substrate 110 includes silicon, fins 120 include silicon. Alternatively, in some implementations, fins 120 are defined in a material layer, such as one or more semiconductor material layers, overlying substrate 110. For example, fins 120 can include a semiconductor layer stack having various semiconductor layers (such as a heterostructure) disposed over substrate 110. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/ . . . ). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aG_b$/ $Si_cGe_d$/ . . . , where a, c are different atomic percentages of silicon and b, d are different atomic percentages of germanium).

Fins 120 are formed over substrate 110 by any suitable process. In some implementations, a combination of deposition, lithography and/or etching processes are performed to define fins 120 extending from substrate 110. For example, forming fins 120 includes performing a lithography process to form a patterned mask layer over substrate 110 (or a material layer, such as a heterostructure, disposed over substrate 110) and performing an etching process to transfer a pattern defined in the patterned mask layer to substrate 110 (or the material layer, such as the heterostructure, disposed over substrate 110). The lithography process can include forming a resist layer on a mask layer disposed over substrate 110 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the mask layer, and then uses the patterned mask layer to remove portions of substrate 110 (or a material layer disposed over substrate 110). The etching process can include a dry etching process (for example, a reactive ion etching (RIE) process), a wet etching process, other suitable etching process, or combinations thereof. The patterned resist layer is removed during or after, for example, by a resist stripping process, the etching process. Alternatively or additionally, fins 120 are formed by a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, double patterning processes and/or multiple patterning processes combine lithography processes and self-aligned processes, allowing patterns to be created that have, for example, pitches smaller than what is otherwise obtainable using a single, direct lithography process. For example, in some implementations, a mandrel layer is used as an etch mask for removing portions of the mask layer, where the mandrel layer is formed using a spacer patterning technique. For example, forming the mandrel layer includes forming a patterned sacrificial layer (which includes sacrificial features having a first spacing) over the mask layer using a lithography process (for example, using the patterned resist layer), forming a spacer layer over the patterned sacrificial layer, etching the spacer layer to form spacers along sidewalls of each sacrificial feature (for example, the spacer layer is removed from a top surface of the sacrificial features and a portion of a top surface of mask layer), and removing the patterned sacrificial layer, leaving spacers having a second spacing (which can be referred to as a patterned spacer layer, which includes openings that expose a portion of the mask layer). Mandrel layer and its mandrels can thus respectively be referred to as a spacer layer and spacers. In some implementations, the spacer layer is conformally formed over the patterned sacrificial layer, such that the spacer layer has a substantially uniform thickness. In some implementations, the spacers are trimmed before or after removing the patterned sacrificial layer. In some implementations, directed self-assembly (DSA) techniques are implemented while forming fins 120.

An isolation feature(s) 122 is formed over and/or in substrate 110 to isolate various regions, such as various device regions, of IC device 100. For example, isolation feature 122 separates and isolates active device regions and/or passive device regions from each other, such as the various FinFETs of memory 10. Isolation feature 122 further separates and isolates fins 120 from one another. In the depicted embodiment, isolation feature 122 surrounds a bottom portion of fins 120. Isolation feature 122 includes silicon oxide, silicon nitride, silicon oxynitride, other suitable isolation material (for example, including silicon, oxygen, nitrogen, carbon, and/or other suitable isolation constituent), or combinations thereof. Isolation feature 122 can include different structures, such as shallow trench isolation (STI) structures, deep trench isolation (DTI) structures, and/or local oxidation of silicon (LOCOS) structures. In some implementations, STI features can be formed by etching a trench in substrate 110 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 122. In some implementations, STI features can be formed by depositing an insulator material over substrate 110 after forming fins 120 (in some implementations, such that the insulator material layer fills gaps (trenches) between fins 120) and etching back the insulator material layer to form isolation feature 122. In some implementations, isolation feature 122 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 122 includes a dielectric layer disposed over a doped liner layer (including, for example, boron silicate glass (BSG) or phosphosilicate glass (PSG)).

Well strap cell 50 further includes gate structures 130 disposed over fins 120 and isolation feature 122, where gate structures 130 are configured the same or similar to gate structures of n-type FinFETs and/or p-type FinFETs of SRAM cells 20A, 20B. Gate structures 130 extend along the y-direction (for example, substantially perpendicular to fins 120) and traverse respective fin structures 120, such that gate structures 130 wrap upper portions of respective fins 120. Gate structures 130 are disposed over and wrap channel regions of fins 120, thereby interposing respective source/drain regions of fins 120. Gate structures 130 engage the respective channel regions of fins 120, such that current can flow between the respective source/drain regions of fins 120 during operation. Gate structures 130 in well strap cell 50 are dummy gate structures, whereas gate structures in memory cells 20 are active gate structures (gate structures 130 are configured the same as gate structures of FinFETs in memory cells 20). "Active gate structure" generally refers to an electrically functional gate structure, whereas "dummy gate structure" generally refers to an electrically non-functional gate structure. For example, gate structures 130 mimic physical properties of active gate structures of FinFETs in memory cells 20, such as physical dimensions of the active gate structures, yet are electrically inoperable (in other words, do not enable current to flow between source/drain regions). In some implementations, gate structures 130 enable a substantially uniform processing environment, for example, enabling uniform epitaxial material growth in source/drain regions of fins 120 (for example, when forming epitaxial source/drain features), uniform etch rates in source/drain regions of fins 120 (for example, when forming source/drain recesses), and/or uniform, substantially planar surfaces (for example, by reducing (or preventing) CMP-induced dishing effects). In the depicted embodiment, gate structures 130 include gate stacks configured the same as gate stacks of gate structures of FinFETs in memory cells 20. For example, a gate stack of each gate structure 130 includes a gate dielectric 132, a gate electrode 134, and a hard mask layer 136, along with gate spacers 138 disposed adjacent to (for example, along sidewalls of) the gate stack. Gate dielectric 132, gate electrode 134, and/or hard mask layer 136 can include the same or different layers and/or materials in gate structures 130. Since gate structures 130 span p-type well strap 50A, n-type well strap 50B, and n-type well strap 50C, gate structures 130 may have different layers in regions corresponding with p-type well strap 50A, n-type well strap 50B, and n-type well strap 50C. For example, a number, configuration, and/or materials of layers of gate dielectric 132 and/or gate electrode 134 corresponding with p-type well strap 50A may be different than a number, configuration, and/or materials of layers of gate dielectric 32 and/or gate electrode 34 corresponding with n-type well strap 50B and/or n-type well strap 50C.

The gate stacks of gate structures 130 are fabricated according to a gate last process, a gate first process, or a hybrid gate last/gate first process. In gate last process implementations, one or more of gate structures 130 include dummy gate stacks that are subsequently replaced with metal gate stacks. The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 132 and/or gate electrode 134 are subsequently formed. In some implementations, a dummy gate stack of at least one of gate structures 130 is replaced with a metal gate stack, while a dummy gate stack of at least one of gate structures 130 remains. For example, some or all of gate structures 130 can include polysilicon gate stacks. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof. A CMP process can be performed to remove any excess material of gate dielectric 132, gate electrode 134, and/or hard mask layer 136, planarizing gate structures 130.

Gate dielectric 132 is disposed over fins 120 and isolation feature 122, such that gate dielectric 132 has a substantially uniform thickness. Gate dielectric 132 includes a dielectric material, such as silicon oxide, high-k dielectric material, other suitable dielectric material, or combinations thereof. In the depicted embodiment, gate dielectric 132 includes one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). In some implementations, gate dielectric 132 further includes an interfacial layer (including a dielectric material, such as silicon oxide) disposed between the high-k dielectric layer and fins 120A and isolation feature 122.

Gate electrode 134 is disposed over gate dielectric 132. Gate electrode 134 includes an electrically conductive material. In some implementations, gate electrode 134 includes multiple layers, such as one or more capping layers, work function layers, glue/barrier layers, and/or metal fill (or bulk) layers. A capping layer can include a material that prevents or eliminates diffusion and/or reaction of constituents between gate dielectric 132 and other layers of gate structures 130 (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. Hard mask layer 136 is disposed over gate electrode 134 and gate electrode 132 and includes any suitable material, such as silicon, nitrogen, and/or carbon (for example, silicon nitride or silicon carbide).

Gate spacers 138 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and subsequently anisotropically etched to form gate spacers 138. In some implementations, gate spacers 138 include a multi-layer structure, such as a first dielectric layer that includes silicon nitride and a second dielectric layer that includes silicon oxide. In some implementations, gate spacers 138 include more than one set of spacers, such as seal spacers, offset spacers, sacrificial spacers, dummy spacers, and/or main spacers, formed adjacent to the gate stacks. In such implementations, the various sets of spacers can include materials having different etching characteristics. For example, a first dielectric layer including silicon and oxygen can be deposited over substrate 110 and subsequently anisotropically etched to form a first spacer set adjacent to the gate stacks, and a second dielectric layer including silicon and nitrogen can be deposited over substrate 110 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown in FIGS. 2A-2G) in source/drain (S/D) regions of fins 120 before and/or after forming gate spacers 138.

Well strap cell 50 further includes source features and drain features (referred to as source/drain features) disposed in source/drain regions of fins 120, where the source/drain features are configured the same or similar to source/drain features of n-type FinFETs and/or p-type FinFETs of SRAM cells 20A, 20B. For example, semiconductor material is epitaxially grown on fins 120, forming epitaxial source/drain features 140A on fins 120 over n-wells 112C, 112D (in other words, in regions of well strap cell 50 configured similar to p-type FinFET regions including p-type FinFETs of SRAM memory cells 20A, 20B) and epitaxial source/drain features 140B on fins 120 over p-well 114C (in other words, in regions of well strap cell 50 configured similar to n-type FinFET regions including n-type FinFETs of SRAM memory cells 20A, 20B). In some implementations, a fin recess process (for example, an etch back process) is performed on source/drain regions of fins 120, such that epitaxial source/drain features 140A, 140B are grown from bottom portions of fins 120. In some implementations, source/drain regions of fins 120 are not subjected to a fin recess process, such that epitaxial source/drain features 140A, 140B are grown from and wrap at least a portion of upper fin active regions of fins 120. Epitaxial source/drain features 140A, 140B can extend (grow) laterally along the y-direction (in some implementations, substantially perpendicular to fins 120), such that epitaxial source/drain features 140A, 140B are merged epitaxial source/drain features that span more than one fin 120. In some implementations, epitaxial source/drain features 140A and/or epitaxial source/drain features 140B include partially merged portions (with interruption (or gaps) between epitaxial material grown from adjacent fins 120) and/or fully merged portions (without interruption (or gaps) between epitaxial material grown from adjacent fins 120).

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 120. Epitaxial source/drain features 140A, 140B are doped with n-type dopants and/or p-type dopants. In some implementations, n-type well straps 50B, 50C and p-type FinFETs in memory cells 20 have the same doped epitaxial source/drain features, and p-type well strap 50A and n-type FinFETs of memory cells 20 have the same doped epitaxial source/drain features. For example, epitaxial source/drain features 140A of n-type well straps 50B, 50C and epitaxial source/drain features of p-type FinFETs in memory cells 20 can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, epitaxial source/drain features 140B of p-type well strap 50A and epitaxial source/drain features of n-type FinFETs in memory cells 20 can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, an Si:As epitaxial layer, or an Si:C:P epitaxial layer). In some implementations, n-type well straps 50B, 50C and p-type FinFETs of memory cells 20 have oppositely doped epitaxial source/drain features, and p-type well strap 50A and n-type FinFETs of memory cells 20 have oppositely doped epitaxial source/drain features. In some implementations, epitaxial source/drain features 140A, 140B include materials and/or dopants that achieve desired tensile stress and/or compressive stress in the channel regions. In some implementations, epitaxial source/drain features 140A, 140B are doped during deposition by adding impurities to a source material of the epitaxy process. In some implementations, epitaxial source/drain features 140A, 140B are doped by an ion implantation process subsequent to a deposition process. In some implementations, annealing processes are performed to activate dopants in epitaxial source/drain features 140A, epitaxial source/drain features 140B, and/or other source/drain features of memory 10, such as HDD regions and/or LDD regions.

A multilayer interconnect (MLI) feature 150 is disposed over substrate 110. MLI feature 150 electrically couples various devices (for example, p-type FinFETs in memory cells 20, n-type FinFETs in memory cells 20, n-type well straps in n-type well strap areas 50A, p-type well straps in p-type well strap area 50B, transistors, resistors, capacitors, and/or inductors) and/or components (for example, gate structures of the p-type FinFETs and/or n-type FinFETs of memory cells 20, source/drain features (for example, epitaxial source/drain features 140A, 140B and/or epitaxial source/drain features of the p-type FinFETs and/or n-type FinFETs of memory cells 20), and/or doped wells of well strap 50 (for example, n-wells 112C, 112D and/or p-well 114C)), such that the various devices and/or components can operate as specified by design requirements of memory 10. MLI feature 150 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 150. During operation, the interconnect features are configured to route signals between the devices and/or the components of memory 10 and/or distribute signals (for example, clock signals, voltage signals, and/or ground signals) to the devices and/or the components of memory 10. For example, MLI feature 150 includes interconnect features configured to route a power supply or ground voltage to p-type well strap 50A and/or n-type well straps 50B, 50C. It is noted that though MLI feature 150 is depicted with a given number of dielectric layers and conductive layers, the present disclosure contemplates MLI feature 150 having more or less dielectric layers and/or conductive layers.

MLI feature 150 includes one or more dielectric layers, such as an interlayer dielectric layer 152 (ILD-0) disposed over substrate 110 (particularly over epitaxial source/drain features 140A, 140B, gate structures 130, and fins 120) and an interlayer dielectric layer 154 (ILD-1) disposed over ILD layer 152. ILD layers 152, 154 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK® (Dow Chemical, Midland, Mich.), polyimide, other low-k dielectric material, or combinations thereof. In the depicted embodiment, ILD layers 152, 154 are dielectric layers that include a low-k dielectric material (generally referred to as low-k dielectric layers). In some implementations, low-k dielectric material generally refers to materials having a dielectric constant (k) that is less than 3. ILD layers 152, 154 can include a multilayer structure having multiple dielectric materials. MLI feature 150 can further include one or more contact etch stop layers (CESLs) disposed between ILD layers 152, 154, such as a CESL disposed between ILD layer 152 and ILD layer 154. In some implementations, a CESL is disposed between substrate 110 and/or isolation feature 122 and ILD layer 152. CESLs include a material different than ILD layers 152, 154, such as a dielectric material that is different than the dielectric material of ILD layers 152, 154. For example, where ILD layers 152, 154 include a low-k dielectric material, CESLs include silicon and nitrogen, such as silicon nitride or silicon oxynitride. ILD layers 152, 154 are formed over substrate 110 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 152, 154 are formed by a flowable CVD (FCVD) process that includes, for example, depositing a flowable material (such as a liquid compound) over substrate 110 and converting the flowable material to a solid material by a suitable technique, such as thermal annealing and/or ultraviolet radiation treating. Subsequent to the deposition of ILD layer 152 and/or the CESL, a CMP process and/or other planarization process is performed until reaching (exposing) a top surface of the gate stacks of gate structures 130. Subsequent to the deposition of ILD layer 154 and/or the CESL, a CMP process and/or other planarization process may be performed.

In FIGS. 2A-2G, device-level contacts (such as n-well contacts 160A and p-well contacts 160B), vias, and/or conductive lines (collectively referred to as a metal one (M1) layer of MLI feature 150) are disposed in one or more of ILD layers 152, 154 to form interconnect structures. Device-level contacts (such as n-well contacts 160A and p-well contacts 160B), vias, and/or conductive lines include any suitable electrically conductive material, such as Ta, Ti, Al, Cu, Co, W, TiN, TaN, other suitable conductive materials, or combinations thereof. Various conductive materials can be combined to provide device-level contacts (such as n-well contacts 160A and p-well contacts 160B), vias, and/or conductive lines with various layers, such as a barrier layer, an adhesion layer, a liner layer, a bulk layer, other suitable layer, or combinations thereof. In some implementations, device-level contacts (such as n-well contacts 160A and p-well contacts 160B) include Ti, TiN, and/or Co; vias include Ti, TiN, and/or W; and conductive lines include Cu, Co, and/or Ru. Device-level contacts (such as n-well contacts 160A and p-well contacts 160B), vias, and/or conductive lines are formed by patterning ILD layers 152, 154. Patterning ILD layers 152, 154 can include lithography processes and/or etching processes to form openings (trenches), such as contact openings, via openings, and/or line openings in respective ILD layers 152, 154. In some implementations, the lithography processes include forming a resist layer over respective ILD layers 152, 154, exposing the resist layer to patterned radiation, and developing the exposed resist layer, thereby forming a patterned resist layer that can be used as a masking element for etching opening(s)

in respective ILD layers 152-154. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layers 152, 154, device-level contacts (such as n-well contacts 160A and p-well contacts 160B), vias, and/or conductive lines.

N-well contacts 160A (also referred to as n-well pick-up regions) are disposed are disposed on respective n-wells 112C, 112D, such that n-well contacts 160A electrically connect n-wells 112C, 112D to a power supply voltage, such as power supply voltage $V_{DD}$; and p-well contacts 160B (also referred to as p-well pick-up regions) are disposed are disposed on p-well 114C, such that p-well contacts 160B electrically connect p-well 114C to a power supply voltage, such as power supply voltage $V_{SS}$. N-well contacts 160A and p-well contacts 160B extend through ILD layer 152, ILD layer 154, and isolation features 122, though the present disclosure contemplates embodiments where n-well contacts 160A and/or p-well contacts 160B extend through more or less ILD layers and/or CESLs of MLI feature 150. In some implementations, one or more of n-well contacts 160A and/or p-well contacts 160B do not electrically connect n-wells 112C, 112D and/or p-well 114A to another electrically conductive feature of MLI feature 150, such as vias. In such implementations, the one or more of n-well contacts 160A and/or p-well contacts 160B are dummy contacts, which have physical properties similar to non-dummy contacts to enable a substantially uniform processing environment.

Figure 3:
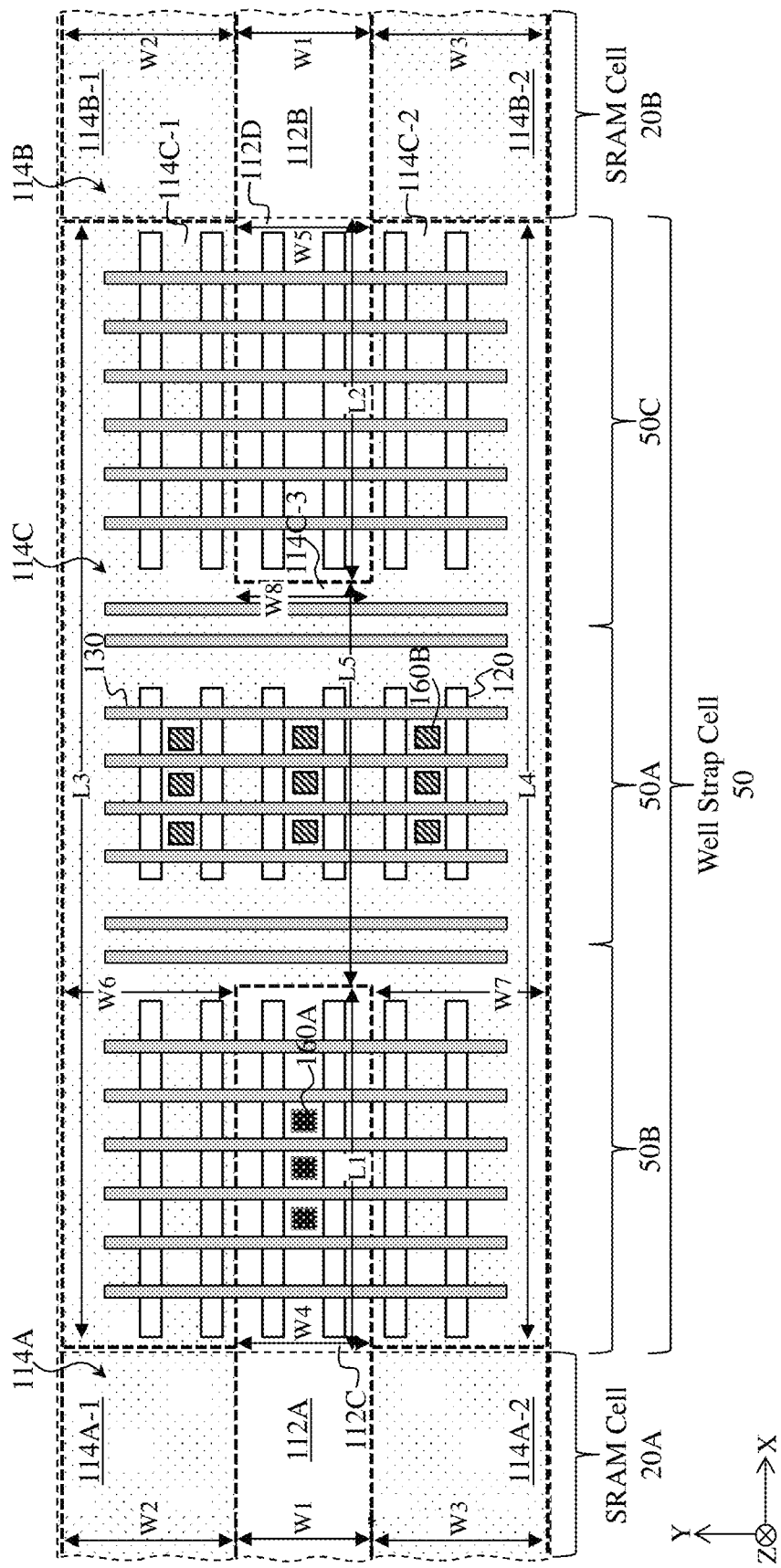
FIG. 3 is a simplified schematic top view of another embodiment of a well strap cell, in portion or entirety, that can be implemented in the memory of FIG. 1 according to various aspects of the present disclosure.

In the depicted embodiment, p-well contacts 160B are disposed in p-type well strap 50A and n-type well straps 50B, 50C are free of p-well contacts 160B. Because p-well strap 50A is free of an n-well, p-well contacts 160B (p-well pick-up regions) exhibit reduced well pick up resistance compared to conventional p-well straps, which typically have a doping configuration similar to n-well straps 50B, 50C, such that p-well contacts are disposed on two p-wells separated by an n-well. In furtherance of the depicted embodiment, p-type well strap 50A has more contacts than n-type well straps 50B, 50C. For example, p-type well strap area 50A includes nine p-well contacts 160B, while n-type well straps 50B, 50C each include three n-well contacts 160A. The present disclosure contemplates any configuration of n-well contacts 160A and/or p-well contacts 160B. For example, FIG. 3 is a simplified schematic top view of another embodiment of a well strap cell, in portion or entirety, such as well strap cell 50 implemented in memory 10 of FIG. 1, according to various aspects of the present disclosure. In FIG. 3, n-well contacts 160A are disposed in one n-well strap, such as n-well strap 50B. In such implementations, n-well strap 50C is free of n-well contacts 160A.

Figure 4:
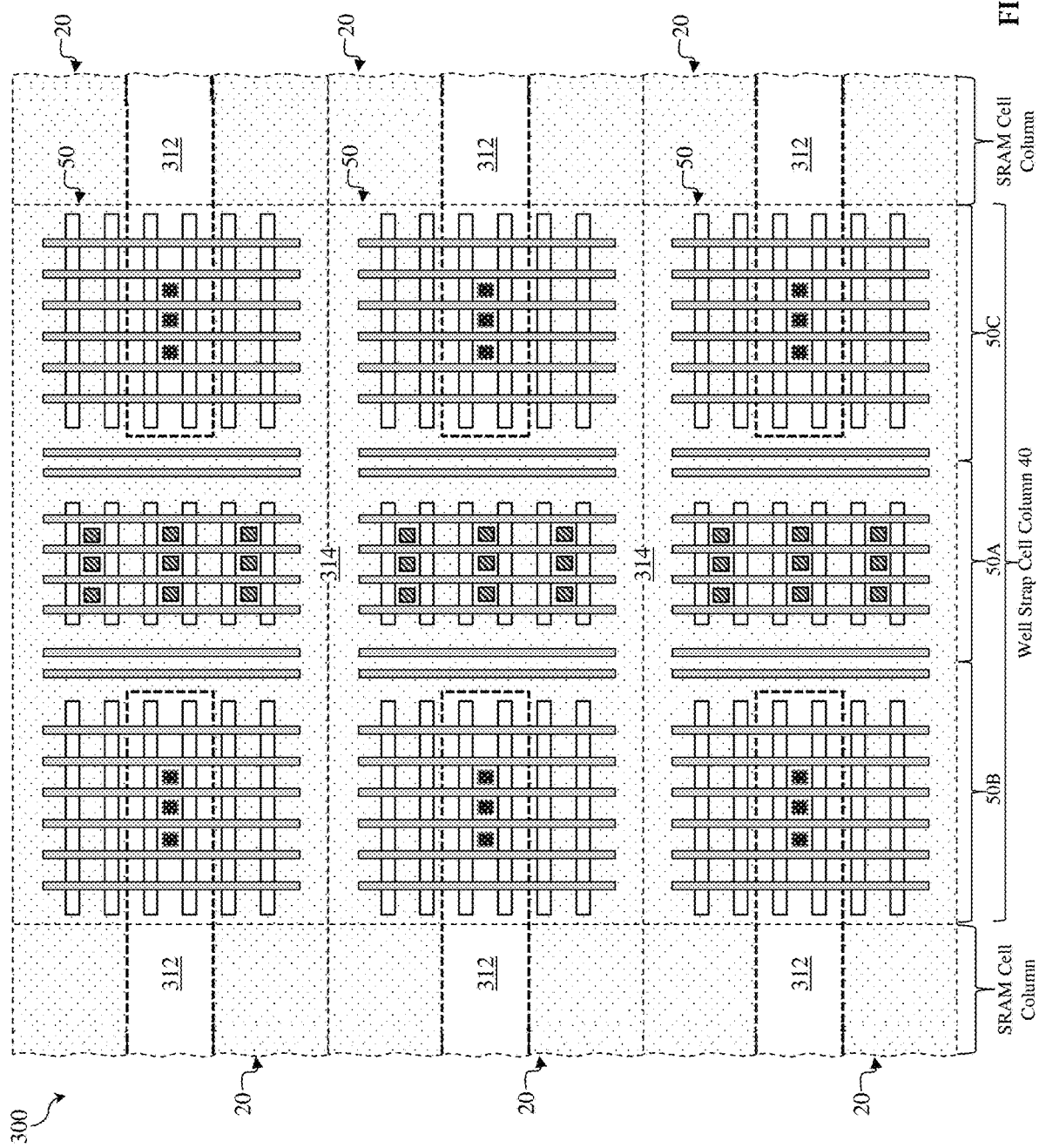
FIG. 4 is a fragmentary top view of a portion of a well strap column that can be implemented in the memory of FIG. 1 according to various aspects of the present disclosure.

FIG. 4 is a fragmentary top view of a portion 300 of well strap column 40 according to various aspects of the present disclosure. In FIG. 4, three well strap cells 50 are arranged in a column between columns of memory cells 20 (such as a column of memory array 12A and a column of memory array 12B). Well strap column 40 includes an n-well 312 that represents combined n-wells of well strap cells 50 and SRAM cells 20 (for example, n-wells 112A, 112B as described above with reference to FIGS. 2A-2G) and a p-well 314 that represents combined p-wells of well strap cells 50 and SRAM cells 20 (for example, p-wells 114A-114C as described above with reference to FIGS. 2A-2G). In FIG. 4, n-well 312 extends from memory cells 20 into n-type well straps 50B, 50C, but not p-type well straps 50A, and p-well extends from memory cells 20 into n-type well straps 50B, 50C and p-type well strap 50A. Because p-well 314 is I-shaped in well strap cells 50, well strap column 40 includes a middle portion that is free of n-wells along an entire length of well strap column 40 (here, along the y-direction). FIG. 4 has been simplified for the sake of clarity to better understand the inventive concepts of the present disclosure. Additional features can be added in portion 300 of well strap column 40, and some of the features described below can be replaced, modified, or eliminated in other embodiments of portion 300 of well strap column 40.

Figure 5:
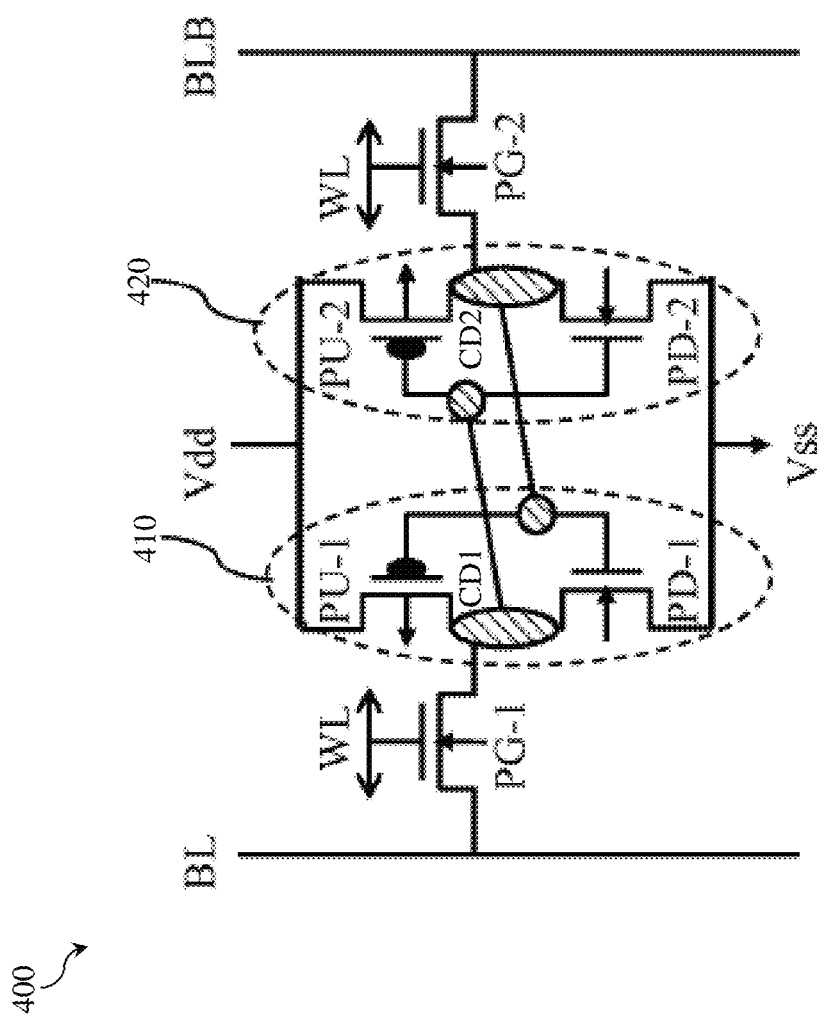
FIG. 5 is a circuit diagram of a single-port SRAM cell, that can be implemented in the memory of FIG. 1 according to various aspects of the present disclosure.

FIG. 5 is a circuit diagram of a single-port SRAM cell 400, which can be implemented in a memory cell of a SRAM, according to various aspects of the present disclosure. For example, single-port SRAM cell 400 is implemented in one or more memory cells 20 of memory 10 (FIG. 1). Single-port SRAM cell 400 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Single-port SRAM cell 400 is thus alternatively referred to as a 6T SRAM cell. In operation, pass-gate transistor PG-1 and pass-gate transistor PG-2 provide access to a storage portion of SRAM cell 400, which includes a cross-coupled pair of inverters, an inverter 410 and an inverter 420. Inverter 410 includes pull-up transistor PU-1 and pull-down transistor PD-1, and inverter 420 includes pull-up transistor PU-2 and pull-down transistor PD-2. FIG. 5 has been simplified for the sake of clarity to better understand the inventive concepts of the present disclosure. Additional features can be added in single-port SRAM cell 400, and some of the features described below can be replaced, modified, or eliminated in other embodiments of single-port SRAM cell 400.

In some implementations, pull-up transistors PU-1, PU-2 are configured as p-type FinFETs. For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, pass-gate transistors PG-1, PG-2 are also configured as n-type FinFETs. For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

Figure 6:
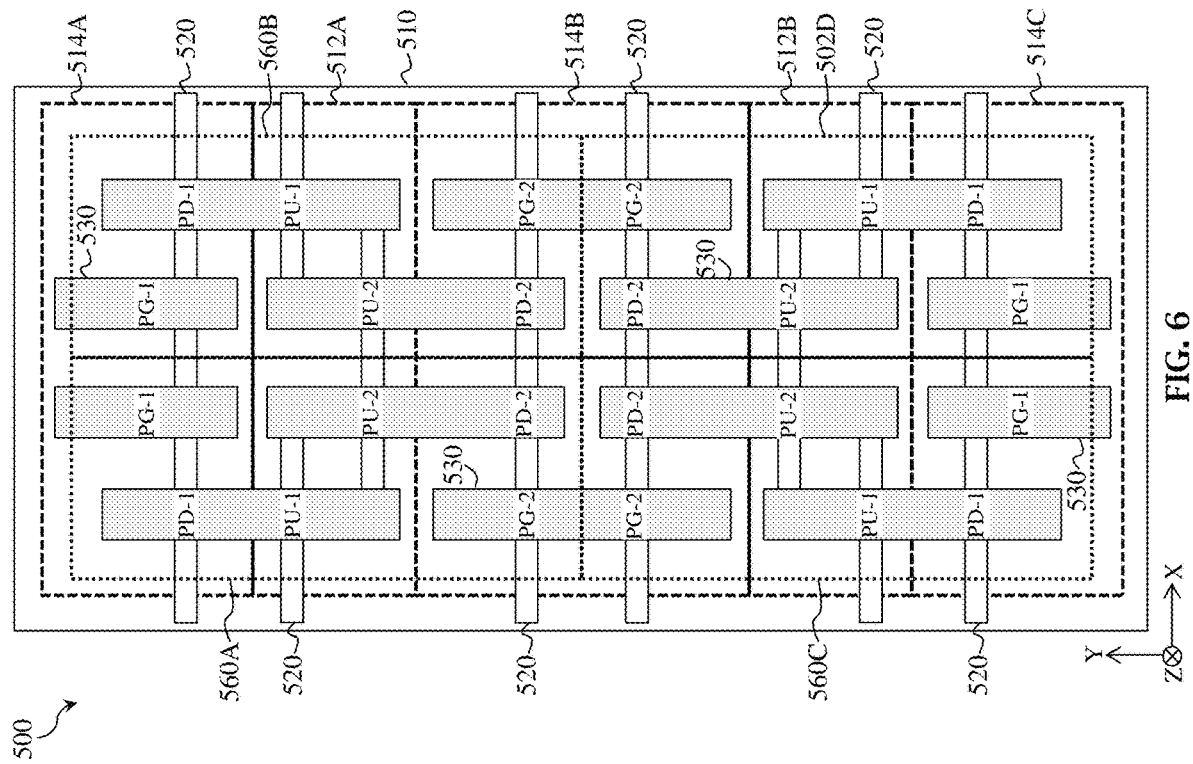
FIG. 6 is a fragmentary top view of a SRAM array, in portion or entirety, that can be implemented in the memory of FIG. 1 according to various aspects of the present disclosure.

FIG. 6 is a fragmentary top view of a SRAM array 500, in portion or entirety, according to various aspects of the present disclosure. In some implementations, SRAM array 500 represents a portion of memory 10, such as a portion of SRAM cells 20. In FIG. 6, SRAM array 500 includes a substrate 510 having various doped regions disposed therein, such as an n-well 512A, an n-well 512B, a p-well 514A, a p-well 514B, and a p-well 514C. Substrate 510, n-wells 512A, 512B, and p-wells 514A-514C are respectively similar to substrate 110, n-wells 112A, 112B, and p-wells 114A-114C described above with reference to FIGS. 2A-2G. SRAM array 500 further includes various features disposed over n-wells 512A, 512B and p-wells 514A-514C, where the various features are configured to achieve desired functionality. For example, SRAM array 500 includes fins 520 (similar to fins 120 described above with reference to FIGS. 2A-2G), isolation feature(s) (similar to isolation feature 222 described above with reference to FIGS. 2A-2G), gate structures 530 (similar to gate structures 130 described above with reference to FIGS. 2A-2G) (including, for example, a gate dielectric, a gate electrode, a hard mask, and/or gate spacers similar to gate dielectric 132, gate electrode 134, hard mask 136, and/or gate spacers 138 as described above with reference to FIGS. 2A-2G), epitaxial source/drain features (similar to epitaxial source/drain features 140A, 140B described above with reference to FIGS. 2A-2G), an MLI feature (similar to MLI feature 150 described above with reference to FIGS. 2A-2G), ILD layers (similar to ILD layers 152, 154 described above with reference to FIGS. 2A-2G), device-level contacts (similar to device-level contacts described above with reference to FIGS. 2A-2G), vias (similar to vias described above with reference to FIGS. 2A-2G), and conductive lines (similar to conductive lines described above with reference to FIGS. 2A-2G). The various features are configured to form a SRAM cell area that includes a SRAM cell 560A, a SRAM cell 560B, a SRAM cell 560C, and a SRAM cell 560D. SRAM cells 560A-560D can be implemented in SRAM cells 20 of memory 10. In some implementations, SRAM cell 560B or SRAM cell 560D can be implemented as SRAM cell 20A adjacent to well strap 50 in FIG. 2. In some implementations, SRAM cell 560A or SRAM cell 560C can be implemented as SRAM cell 20B adjacent to well strap 50 in FIG. 2. FIG. 6 has been simplified for the sake of clarity to better understand the inventive concepts of the present disclosure. Additional features can be added in SRAM array 500, and some of the features described below can be replaced, modified, or eliminated in other embodiments of SRAM array 500.

SRAM cells 560A-560D include a single port SRAM, a dual-port SRAM, other type SRAM, or combinations thereof. In the depicted embodiment, SRAM cells 560A-560D include single port SRAMs. For example, each of SRAM cells 560A-560D include six transistors: a pass-gate transistor PG-1, a pass-gate transistor PG-2, a pull-up transistor PU-1, a pull-up transistor PU-2, a pull-down transistor PD-1, and a pull-down transistor PD-1. Each of SRAM cells 560A-560D includes an n-well disposed between p-wells. For example, SRAM cells 560A, 560B each include n-well 512A disposed between p-well 514A and p-well 514B, where pull-up transistors PU-1, PU-2 are disposed over n-well 512A and pass-gate transistors PG-1, PG-2 and pull-down transistors PD-1, PD-2 are disposed over p-well 514A or p-well 514B. SRAM cells 560C, 560D each include n-well 512B disposed between p-well 514B and p-well 514C, where pull-up transistors PU-1, PU-2 are disposed over n-well 512B and pass-gate transistors PG-1, PG-2 and pull-down transistors PD-1, PD-2 are disposed over p-well 514B or p-well 514C. Pull-up transistors PU-1, PU-2 are p-type FinFETs, pass-gate transistors PG-1, PG-2 are n-type FinFETs, and pull-down transistors PD-1, PD-2 are p-type transistors. In some implementations, pull-up transistors PU-1, PU-2 are configured as p-type FinFETs, while pass-gate transistors PG-1, PG-2 and pull-down transistors PD-1, PD-2 are configured as n-type FinFETs. For example, pass-gate transistors PG-1, PG-2 and/or pull-down transistors PD-1, PD-2 each include a fin structure (including one or more fins 520) disposed over a respective p-type well and a respective gate structure 430 disposed over a channel region of the fin structure, such that the respective gate structure 430 interposes source/drain regions of the fin structure. The fin structures of pass-gate transistors PG-1, PG-2 and/or pull-down transistors PD-1, PD-2 include p-type dopants and are electrically connected to the p-type wells. The fin structures of pass-gate transistors PG-1, PG-2 and/or pull-down transistors PD-1, PD-2 further include n-type epitaxial source/drain features (in other words, epitaxial source/drain features of pass-gate transistors PG-1, PG-2 and/or pull-down transistors PD-1, PD-2 include n-type dopants). Gate structures 430 and/or epitaxial source/drain features of pass-gate transistors PG-1, PG-2 and/or pull-down transistors PD-1, PD-2 are electrically connected to a voltage source (for example, $V_{SS}$) by the MLI feature, such as MLI feature 150. In furtherance of the example, pull-up transistors PU-1, PU-2 each include a fin structure (including one or more fins 520) disposed over a respective n-type well and a respective gate structure 530 disposed over a channel region of the fin structure, such that the respective gate structure 530 interposes source/drain regions of the fin structure. The fin structures of pull-up transistors PU-1, PU-2 include n-type dopants and are electrically connected to n-type wells. The fin structures of pull-up transistors PU-1, PU-2 further includes p-type epitaxial source/drain features (in other words, epitaxial source/drain features of pull-up transistors PU-1, PU-2 include p-type dopants). Gate structures 530 and/or epitaxial source/drain features of pull-up transistors PU-1, PU-2 are electrically connected to a voltage source (for example, $V_{DD}$) by the MLI feature. In the present example, pull-up transistors PU-1, PU-2, pass-gate transistors PG-1, PG-2, and pull-down transistors PD-1, PD-2 are single fin FinFETs (in other words, the fin structures include one fin), though the present disclosure contemplates implementations where one or more of pull-up transistors PU-1, PU-2, pass-gate transistors PG-1, PG-2, and pull-down transistors PD-1, PD-2 are multi-fin FinFETS (in other words, the fin structures includes multiple fins).

The present disclosure provides for many different embodiments. Fin-based well straps and methods of fabrication thereof are disclosed herein for improving performance of memory arrays, such as SRAM arrays. An exemplary integrated circuit (IC) device includes a memory cell having a first well doping configuration that includes a first well region, a second well region, and a third well region disposed in a substrate. The second well region is disposed between the first well region and the third well region. The first well region and the third well region are doped with a first type dopant and the second well region is doped with a second type dopant. The integrated circuit further includes a well strap cell disposed adjacent to the memory cell. The well strap cell has a first well strap area, a second well strap area, and a third well strap area, the second well strap area being disposed between the first well strap area and the third well strap area. The first well strap area and the third well strap area have the first well doping configuration. The second well strap area has a second doping configuration that includes a fourth well region that is doped with the first type dopant. The well strap cell includes first well pick-up regions to the fourth well region and second well pick-up regions to the second well region. In some implementations, the first well region, the third well region, and the fourth well region combine to form an I-shaped well region in the well strap cell that is doped with the first type dopant. In some implementations, the first type dopant is a p-type dopant and the second type dopant is an n-type dopant.

In some implementations, the first well region, the second well region, the third well region, and the fourth well region extend along a direction that is perpendicular to a gate length direction. In some implementations, the fourth well region has a width that is substantially equal to a width of the well strap cell. In some implementations, the second well pick-up regions are disposed in the second well region in only the first well strap area or the third well strap area. In some implementations, the first well pick-up regions are connected to a first voltage and the second well pick-up regions are connected to a second voltage that is different than the first voltage. In some implementations, the well strap cell includes fins, gate structures, and epitaxial source/drain features configured as dummy fin-like field effect transistors (FinFETs).

An exemplary well strap cell is disposed between a first memory cell and a second memory cell. The well strap cell includes a p-well, a first n-well, and a second n-well disposed in a substrate. The p-well, the first n-well, and the second n-well are configured in the well strap cell such that a middle portion of the well strap cell is free of the first n-well and the second n-well along a gate length direction. The well strap cell further includes p-well pick up regions to the p-well and n-well pick up regions to the first n-well, the second n-well, or both. In some implementations, the p-well has an I-shaped top view along the gate length direction. In some implementations, a sum of a width of the first n-well, a width of the second n-well, and a middle portion of the well strap cell that is free of the first n-well and the second n-well along the gate length direction is substantially equal to a width of the well strap cell. In some implementations, the well strap cell is a fin-based well strap cell that includes fins extending along a direction perpendicular to the gate length direction.

In some implementations, the middle portion of the well strap cell is disposed between a first edge portion of the well strap cell and a second edge portion of the well strap cell, wherein the middle portion includes a first sub-region of the p-well; the first edge portion includes the first n-well disposed between a second sub-region of the p-well and a third sub-region of the p-well along the gate length direction, wherein the second sub-region of the p-well and the third sub-region of the p-well extend from the first sub-region of the p-well; and the second edge portion includes the second n-well disposed between a fourth sub-region of the p-well and a fifth sub-region of the p-well along the gate length direction, wherein the fourth sub-region of the p-well and the fifth sub-region of the p-well extend from the first sub-region of the p-well. In such implementations, the middle portion may correspond with a p-type well strap, the first edge portion may correspond with a first n-type well strap, and the second edge portion may correspond with a second n-type well strap. The p-type well strap is disposed between the first n-type well strap and the second n-type well strap.

In some implementations, first gate structures are disposed in the middle portion of the well strap cell, such that the first gate structures are disposed over the p-well; second gate structures are disposed in the first edge portion of the well strap cell, such that the second gate structures are disposed over the first n-well, the second sub-region of the p-well, and the third sub-region of the p-well; and third gate structures are disposed in the second edge portion of the well strap cell, such that the third gate structures are disposed over the second n-well, the fourth sub-region of the p-well, and the fifth sub-region of the p-well. In some implementations, the p-well pick up regions are disposed in the middle portion of the well strap cell that is free of the first n-well and the second n-well along the gate length direction. In some implementations, at least one of the p-well pick up regions is disposed between the first n-well and the second n-well along a direction perpendicular to the gate length direction.

An exemplary memory array includes a first memory cell column and a second memory cell column. Each memory cell of the first memory cell column and each memory cell of the second memory cell column has a first well doping configuration. The memory array further includes a well strap cell column disposed between the first memory cell column and the second memory cell column. Each well strap cell in the well strap column includes a p-type well strap disposed between a first n-type well strap and a second n-type well strap. The first n-type well strap and the second n-type well strap have the first well doping configuration. The p-type well strap has a second well doping configuration that is different than the first well doping configuration. In some implementations, the first well doping configuration includes an n-well and the second well doping configuration is free of an n-well. In some implementations, the p-type well strap includes p-well pick-up regions disposed between an n-well of the first n-type well strap and an n-well of the second n-type well strap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a memory cell having a first well doping configuration that includes a first well region, a second well region, and a third well region disposed in a substrate, wherein the second well region is disposed between the first well region and the third well region, and further wherein the first well region and the third well region are doped with a first type dopant and the second well region is doped with a second type dopant; and
a well strap cell disposed adjacent to the memory cell, wherein:
the well strap cell has a first well strap area, a second well strap area, and a third well strap area, the second well strap area being disposed between the first well strap area and the third well strap area,
the first well strap area and the third well strap area have the first well doping configuration,
the second well strap area has a second doping configuration that includes a fourth well region disposed in the substrate, wherein the fourth well region is doped with the first type dopant, and
the well strap cell includes first well pick-up regions that contact the fourth well region and second well pick-up regions that contact the second well region.

2. The integrated circuit of claim 1, wherein the first well region, the third well region, and the fourth well region combine to form an I-shaped well region in the well strap cell that is doped with the first type dopant.

3. The integrated circuit of claim 1, wherein the first type dopant is a p-type dopant and the second type dopant is an n-type dopant.

4. The integrated circuit of claim 1, wherein the first well region, the second well region, the third well region, and the fourth well region extend along a direction that is perpendicular to a gate length direction.

5. The integrated circuit of claim 1, wherein the fourth well region has a width that is substantially equal to a width of the well strap cell.

6. The integrated circuit of claim 1, wherein the second well pick-up regions are disposed in the second well region in only the first well strap area or the third well strap area.

7. The integrated circuit of claim 1, wherein the first well pick-up regions are connected to a first voltage and the second well pick-up regions are connected to a second voltage that is different than the first voltage.

8. The integrated circuit of claim 1, wherein the well strap cell includes fins, gate structures, and epitaxial source/drain features configured as dummy fin-like field effect transistors (FinFETs).

9. A memory comprising:
a well strap cell disposed between a first memory cell and a second memory cell, wherein the well strap cell includes:
a p-well, a first n-well, and a second n-well disposed in a substrate, wherein the p-well, the first n-well, and the second n-well are configured in the well strap cell such that a middle portion of the well strap cell is free of the first n-well and the second n-well along a gate length direction,
p-well pick up regions disposed on the p-well, and
n-well pick up regions disposed on the first n-well, the second n-well, or both.

10. The memory of claim 9, wherein the p-well has an I-shaped top view along the gate length direction.

11. The memory of claim 9, wherein:
the middle portion of the well strap cell is disposed between a first edge portion of the well strap cell and a second edge portion of the well strap cell, wherein the middle portion includes a first sub-region of the p-well;
the first edge portion includes the first n-well disposed between a second sub-region of the p-well and a third sub-region of the p-well along the gate length direction, wherein the second sub-region of the p-well and the third sub-region of the p-well extend from the first sub-region of the p-well; and
the second edge portion includes the second n-well disposed between a fourth sub-region of the p-well and a fifth sub-region of the p-well along the gate length direction, wherein the fourth sub-region of the p-well and the fifth sub-region of the p-well extend from the first sub-region of the p-well.

12. The memory of claim 11, wherein the middle portion corresponds with a p-type well strap, the first edge portion corresponds with a first n-type well strap, and the second edge portion corresponds with a second n-type well strap, wherein the p-type well strap is disposed between the first n-type well strap and the second n-type well strap.

13. The memory of claim 11, further comprising:
first gate structures disposed in the middle portion of the well strap cell, such that the first gate structures are disposed over the p-well;
second gate structures disposed in the first edge portion of the well strap cell, such that the second gate structures are disposed over the first n-well, the second sub-region of the p-well, and the third sub-region of the p-well; and
third gate structures disposed in the second edge portion of the well strap cell, such that the third gate structures are disposed over the second n-well, the fourth sub-region of the p-well, and the fifth sub-region of the p-well.

14. The memory of claim 9, wherein a sum of a width of the first n-well, a width of the second n-well, and a middle portion of the well strap cell that is free of the first n-well and the second n-well along the gate length direction is substantially equal to a width of the well strap cell.

15. The memory of claim 9, wherein the p-well pick up regions are disposed in the middle portion of the well strap cell that is free of the first n-well and the second n-well along the gate length direction.

16. The memory of claim 9, wherein at least one of the p-well pick up regions is disposed between the first n-well and the second n-well along a direction perpendicular to the gate length direction.

17. The memory of claim 9, wherein the well strap cell is a fin-based well strap cell that includes fins extending along a direction perpendicular to the gate length direction.

18. A memory array comprising:
a first memory cell column, wherein each memory cell of the first memory cell column has a first well doping configuration;

a second memory cell column, wherein each memory cell of the second memory cell column has the first well doping configuration; and a well strap cell column disposed between the first memory cell column and the second memory cell column, wherein each well strap cell in the well strap column includes a p-type well strap disposed between a first n-type well strap and a second n-type well strap, and further wherein the first n-type well strap and the second n-type well strap have the first well doping configuration and the p-type well strap has a second well doping configuration that is different than the first well doping configuration.

19. The memory array of claim 18, wherein the first well doping configuration includes an n-well and the second well doping configuration is free of an n-well.

20. The memory array of claim 18, wherein the p-type well strap includes p-well pick-up regions disposed between an n-well of the first n-type well strap and an n-well of the second n-type well strap.

* * * * *